US012610535B2

(12) United States Patent
     Chiang

(10) Patent No.:     US 12,610,535 B2
(45) Date of Patent:          Apr. 21, 2026

(54) SEMICONDUCTOR STRUCTURE INCLUDING A BIT LINE STRUCTURE AND METHOD OF MANUFACTURING THE SAME

(71) Applicant: NANYA TECHNOLOGY CORPORATION, New Taipei City (TW)

(72) Inventor: Hsu Chiang, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 384 days.

(21) Appl. No.: 18/539,595

(22) Filed: Dec. 14, 2023

(65) Prior Publication Data

US 2025/0176245 A1      May 29, 2025

Related U.S. Application Data

(62) Division of application No. 18/518,721, filed on Nov. 24, 2023.

(51) Int. Cl.
     *H10B 12/00*      (2023.01)
     *H10W 20/00*      (2026.01)
     *H10W 20/45*      (2026.01)
     *H10W 20/47*      (2026.01)
     H10D 64/23       (2025.01)

(52) U.S. Cl.
     CPC ........ *H10B 12/482* (2023.02); *H10W 20/075* (2026.01); *H10W 20/077* (2026.01); *H10W 20/455* (2026.01); *H10W 20/47* (2026.01); *H10D 64/251* (2025.01); *H10W 20/069* (2026.01)

(58) Field of Classification Search
     CPC ...... H10B 12/482; H10D 64/251–259; H10W 20/074; H10W 20/075; H10W 20/077; H10W 20/098; H10W 20/455; H10W 20/47; H10W 20/069–0696
     See application file for complete search history.

(56) References Cited

U.S. PATENT DOCUMENTS

2012/0217631 A1     8/2012   Kim et al.
2021/0035984 A1*    2/2021   Ji ....................... H10B 12/0335
                              (Continued)

FOREIGN PATENT DOCUMENTS

TW       202336848 A     9/2023
TW       202343746 A     11/2023

OTHER PUBLICATIONS

Office Action and and the search report mailed on May 21, 2025 related to Taiwanese Application No. 113125798.
                              (Continued)

*Primary Examiner* — Yu Chen
(74) *Attorney, Agent, or Firm* — Xuan Zhang

(57)                    ABSTRACT

A semiconductor structure and a method of manufacturing the same are provided. The semiconductor structure includes a base structure, a bit line structure and a spacer. The bit line structure is disposed over the base structure. The spacer is disposed around the bit line structure, and includes a first layer, a second layer and a third layer. The third layer is disposed over the second layer. A width of the third layer is substantially equal to a width of the second layer.

8 Claims, 10 Drawing Sheets

(56)                    References Cited

U.S. PATENT DOCUMENTS

2022/0059543 A1 *  2/2022  Mun ................... H10B 12/0335
2022/0102353 A1     3/2022  Kim et al.
2022/0344341 A1 *  10/2022  Kim .................... H10B 12/315
2025/0048619 A1 *   2/2025  Kang ................... H10B 12/482

OTHER PUBLICATIONS

Summary translation of Office Action and and the search report mailed on May 21, 2025 related to Taiwanese Application No. 113125798.

* cited by examiner

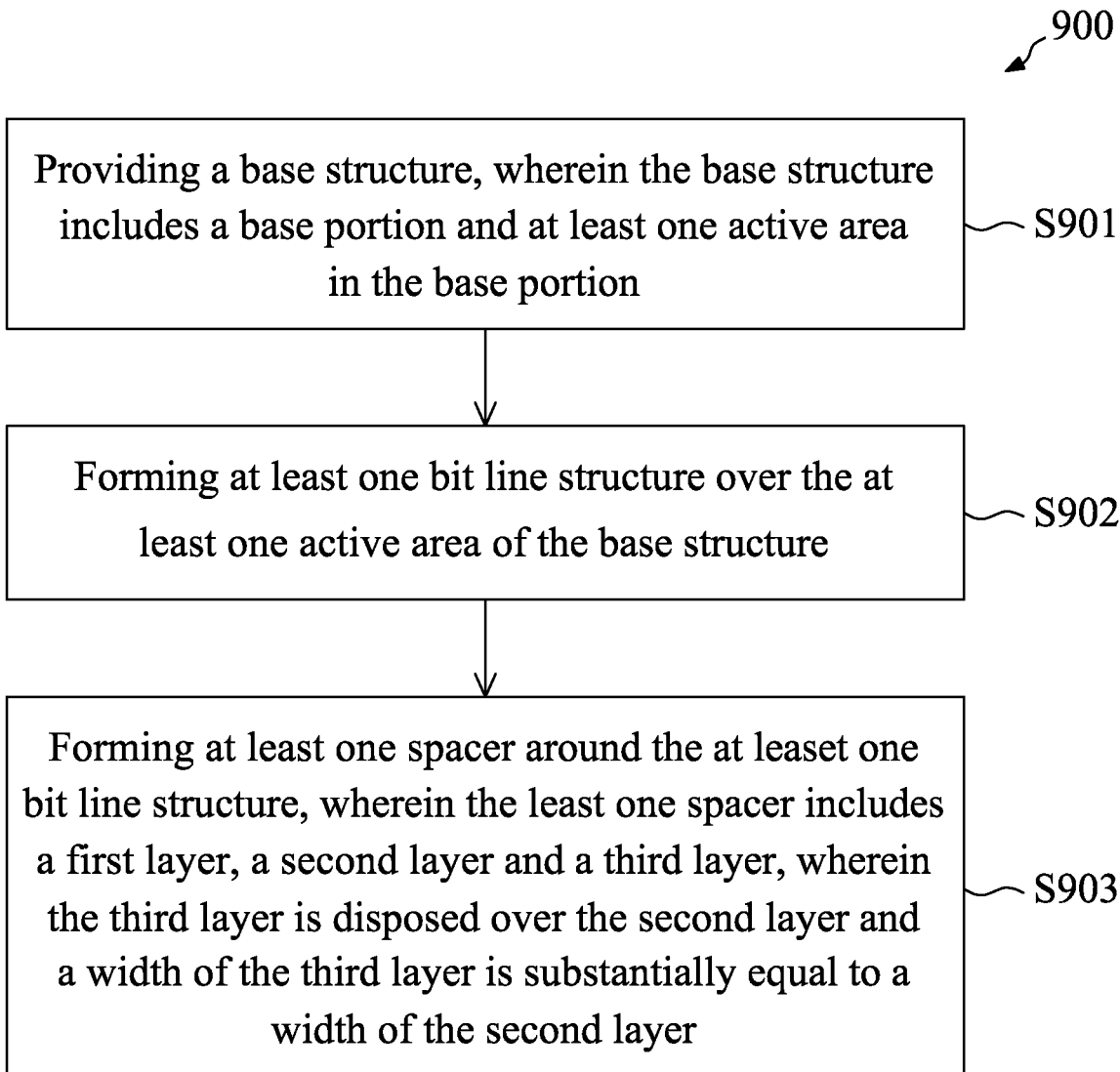

900

Providing a base structure, wherein the base structure includes a base portion and at least one active area in the base portion ~S901

Forming at least one bit line structure over the at least one active area of the base structure ~S902

Forming at least one spacer around the at leaset one bit line structure, wherein the least one spacer includes a first layer, a second layer and a third layer, wherein the third layer is disposed over the second layer and a width of the third layer is substantially equal to a width of the second layer ~S903

FIG. 10

SEMICONDUCTOR STRUCTURE INCLUDING A BIT LINE STRUCTURE AND METHOD OF MANUFACTURING THE SAME

CROSS-REFERENCE TO RELATED APPLICATION

This application is a divisional application of U.S. Non-Provisional application Ser. No. 18/518,721 filed Nov. 24, 2023, which is incorporated herein by reference in its entirety.

TECHNICAL FIELD

The present disclosure relates to a semiconductor structure and a method of manufacturing the same, and more particularly, to a semiconductor structure including bit line structure, and a method of manufacturing the same.

DISCUSSION OF THE BACKGROUND

Semiconductor structures are used in a variety of electronic applications, and the dimensions of semiconductor structures are continuously being scaled down to meet the current application requirements. However, a variety of issues arise during the scaling-down process and impact the final electrical characteristics, quality, cost and yield. Typical memory devices (such as dynamic random access memory (DRAM) devices) include signal lines, such as word lines and bit lines crossing the word lines. As DRAM devices are scaled down and the dimensions and/or pitches of the signal lines are getting smaller, the parasitic capacitance will be a critical concern.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor structure. The semiconductor structure includes a base structure, a bit line structure and a spacer. The bit line structure is disposed over the base structure. The spacer is disposed around the bit line structure, and includes a first layer, a second layer and a third layer. The third layer is disposed over the second layer. A width of the third layer is substantially equal to a width of the second layer.

Another aspect of the present disclosure provides a semiconductor structure. The semiconductor structure includes a base structure, a first bit line structure, a second bit line structure, a first spacer and a second spacer. The first bit line structure is disposed over the base structure. The second bit line structure is disposed over the base structure. The first spacer is disposed around the first bit line structure, and includes a first layer, a second layer and a third layer. The third layer of the first spacer is disposed over the second layer of the first spacer. A width of the third layer of the first spacer is substantially equal to a width of the second layer of the first spacer. The second spacer is disposed around the second bit line structure, and includes a first layer, a second layer and a third layer. The third layer of the second spacer is disposed over the second layer of the second spacer. A width of the third layer of the second spacer is substantially equal to a width of the second layer of the second spacer.

Another aspect of the present disclosure provides a method of manufacturing a semiconductor structure. The method includes: providing a base structure, wherein the base structure includes a base portion and at least one active area in the base portion; forming at least one bit line structure over the at least one active area of the base structure; and forming at least one spacer around the at least one bit line structure, wherein the least one spacer includes a first layer, a second layer and a third layer, wherein the third layer is disposed over the second layer and a width of the third layer is substantially equal to a width of the second layer.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 10 illustrates a flow chart of a method of manufacturing a semiconductor structure according to some embodiments of the present disclosure.

DETAILED DESCRIPTION

Figure 1:
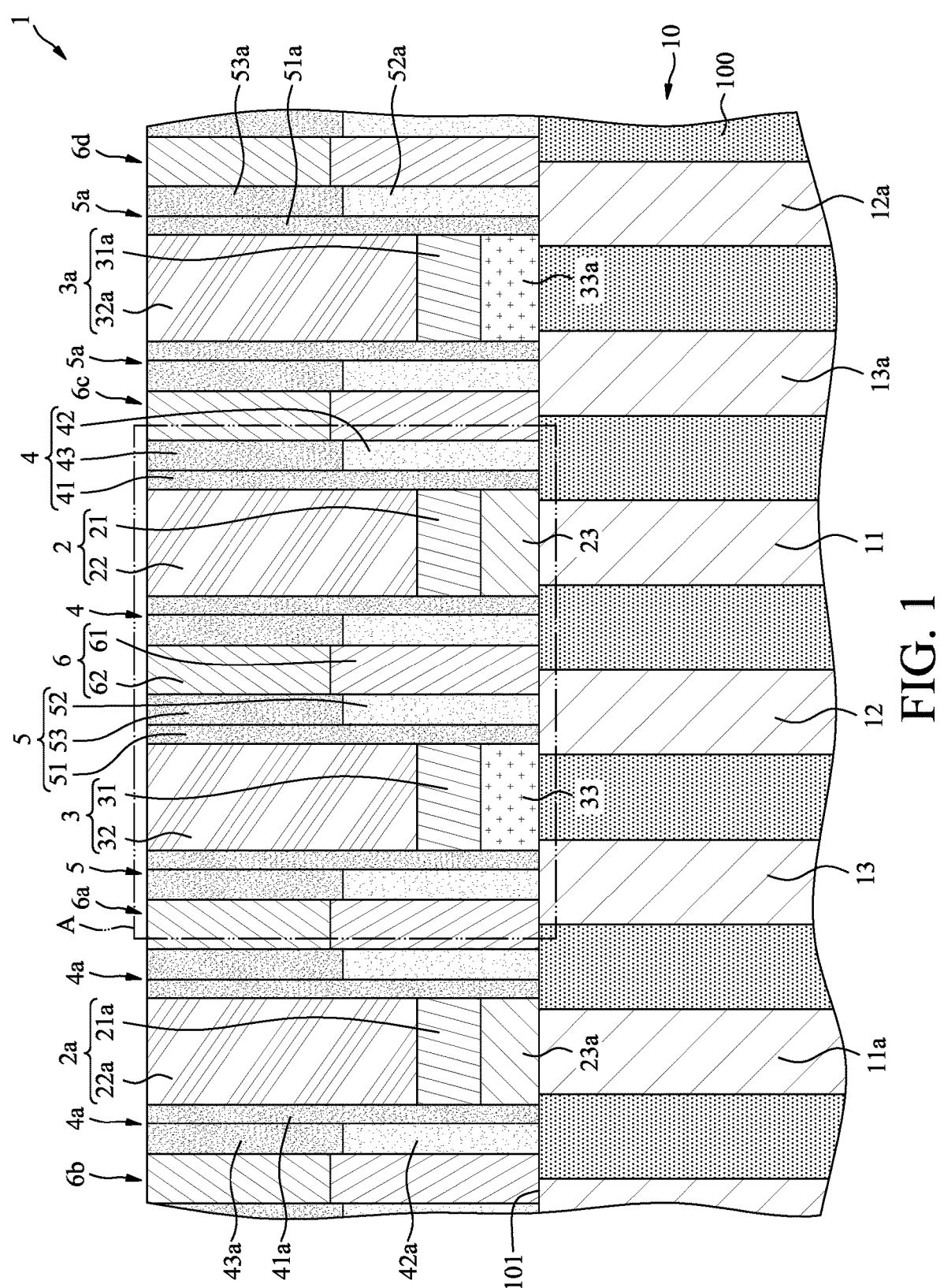
FIG. 1 illustrates a cross-sectional view of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
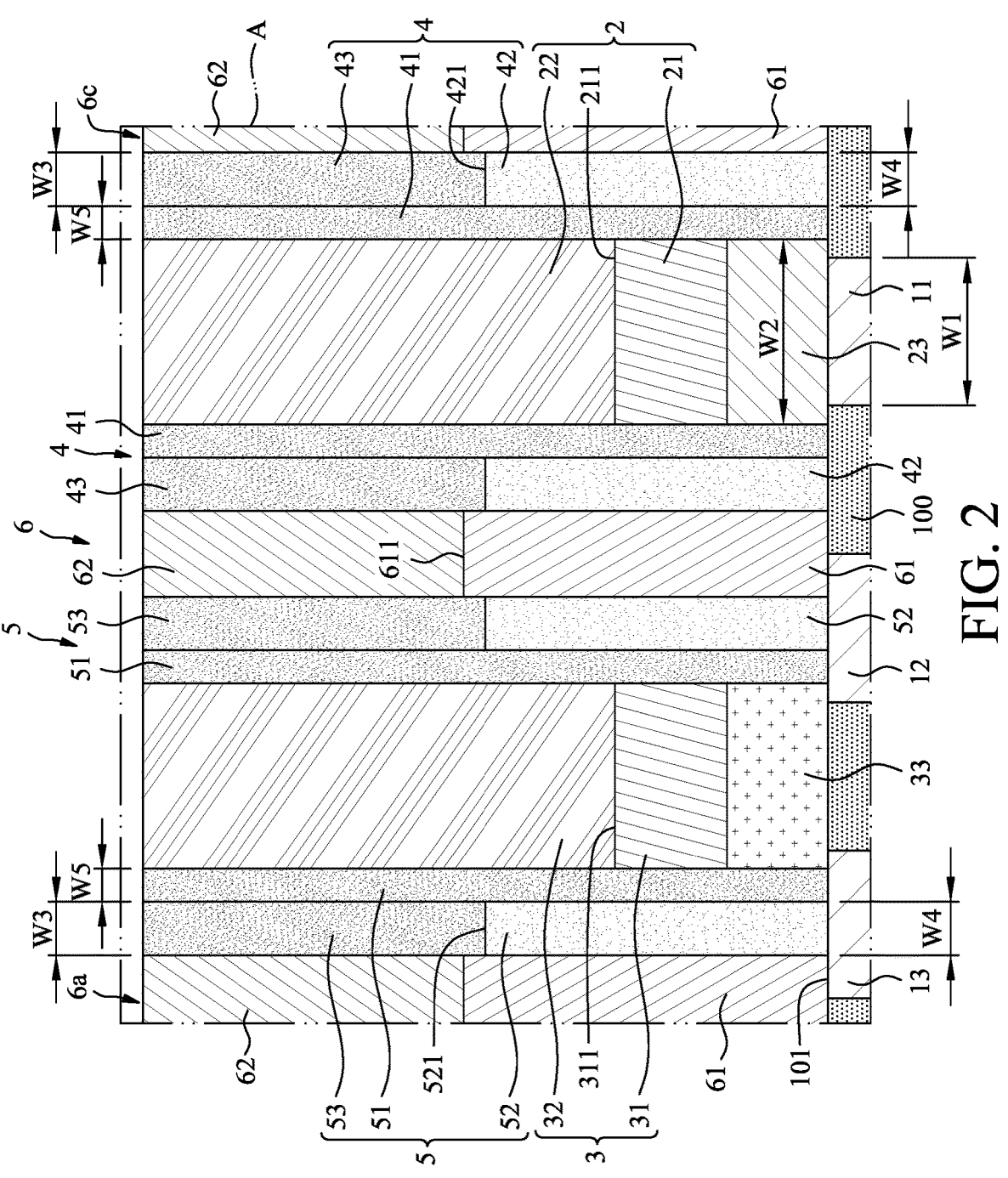
FIG. 2 illustrates an enlarged view of an area "A" of FIG. 1.

FIG. 1 illustrates a cross-sectional view of a semiconductor structure 1 in accordance with some embodiments of the present disclosure. FIG. 2 illustrates an enlarged view of an area "A" of FIG. 1. In some embodiments, the semiconductor structure 1 may be a semiconductor device that includes a circuit, such as a memory cell. In some embodiments, the memory cell may include a dynamic random access memory cell (DRAM cell).

In addition, the semiconductor structure 1 may be or include a portion of an integrated circuit (IC) chip that includes various passive and active microelectronic devices, such as resistors, capacitors, inductors, diodes, p-type field-effect transistors (pFETs), n-type field-effect transistors (nFETs), metal-oxide semiconductor field-effect transistors (MOSFETs), complementary metal-oxide semiconductor (CMOS) transistors, bipolar junction transistors (BJTs), laterally-diffused MOS (LDMOS) transistors, high-voltage transistors, high-frequency transistors, fin field-effect transistors (FinFETs), other suitable IC components, or combinations thereof.

The semiconductor structure 1 may include a base structure 10, at least one bit line structure (e.g., a first bit line structure 2, a second bit line structure 3, a third bit line structure 2*a* and a fourth bit line structure 3*a*), at least one spacer (e.g., a first spacer 4, a second spacer 5, a third spacer 4*a* and a fourth spacer 5*a*) and at least one cell contact structure (e.g., a first cell contact structure 6, a second cell contact structure 6*a*, a third cell contact structure 6*b*, a fourth cell contact structure 6*c* and a fifth cell contact structure 6*d*).

The base structure 10 may be a substrate, and may include a dielectric material, such as an oxide material or a nitride material. Alternatively, the base structure 10 may be a substrate, and may include, for example, silicon (Si), germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some embodiments, the base structure 10 may include a base portion 100 and at least active area (e.g., a first active area 11, a second active area 12, a third active area 13, a fourth active area 11*a*, a fifth active area 12*a* and a sixth active area 13*a*) disposed in or embedded in the base portion 100. The base portion 100 may include dielectric oxide material. Each of the active areas (e.g., the first active area 11, the second active area 12, the third active area 13, the fourth active area 11*a*, the fifth active area 12*a* and the sixth active area 13*a*) may include silicon (Si) material. For example, each of the first active area 11 and the fourth active area 11*a* may be a drain electrode. Each of the second active area 12, the third active area 13, the fifth active area 12*a* and the sixth active area 13*a* be a source electrode.

In some embodiments, as shown in FIG. 1, the base structure 10 may have a first surface 101 (e.g., a top surface). The active areas (e.g., the first active area 11, the second active area 12, the third active area 13, the fourth active area 11*a*, the fifth active area 12*a* and the sixth active area 13*a*) may be exposed from the first surface 101 (e.g., the top surface) of the base structure 10.

The at least one bit line structure may include a plurality of bit line structures, e.g., the first bit line structure 2, the second bit line structure 3, the third bit line structure 2*a* and the fourth bit line structure 3*a*, and may be disposed over the base structure 10. The first bit line structure 2 may include a main portion 21 and a cap portion 22 disposed on the main portion 21. The main portion 21 may include tungsten (W), and the cap portion 22 may include silicon nitride (SiN). The main portion 21 of the first bit line structure 2 may be electrically connected to the first active area 11 through a conductor 23. The conductor 23 may be an electrical contact and may be disposed between the main portion 21 of the first bit line structure 2 and the first active area 11. An example of a material of the conductor 23 may include polysilicon. The first active area 11 may be disposed right under the first bit line structure 2. A width W1 of the first active area 11 may be less than a width W2 of the conductor 23. The width W2 of the conductor 23 may be substantially equal to a width of the first bit line structure 2. Thus, the first bit line structure 2 may completely vertically overlap the first active area 11. The entire first active area 11 may be disposed within a vertical projection of the first bit line structure 2.

The first spacer 4 may be disposed around or adjacent to the first bit line structure 2. The first spacer 4 may include a first layer 41, a second layer 42 and a third layer 43. The first layer 41 may include silicon nitride (SiN), the second layer 42 may include oxide material such as silicon oxide (SiO$_2$), and the third layer 43 may include silicon nitride (SiN). The third layer 43 may be disposed over or disposed on the second layer 42. A width W3 of the third layer 43 may be substantially equal to a width W4 of the second layer 42.

The first layer 41 may be interposed between the second layer 42 and the first bit line structure 2. A width W5 of the first layer 41 may be less than the width W4 of the second layer 42. For example, the width W5 of the first layer 41 may be substantially equal to one half of the width W4 of the second layer 42. The material of the first layer 41 may be different from the material of the second layer 42. In addition, the first layer 41 may be interposed between the third layer 43 and the first bit line structure 2. The width W5 of the first layer 41 may be less than the width W3 of the third layer 43. For example, the width W5 of the first layer 41 may be substantially equal to one half of the width W3 of the third layer 43. The material of the first layer 41 may be same as the material of the third layer 43.

As shown in FIG. 2, a lateral surface of the second layer 42 may be substantially aligned with a lateral surface of the third layer 43. The first layer 41 may contact the lateral surface of the second layer 42 and the lateral surface of the third layer 43. A length (or a height) of the first layer 41 may substantially equal to a sum of a length (or a height) of the second layer 42 and a length (or a height) of the third layer 43. In addition, an elevation of a top surface 211 of the main portion 21 of the first bit line structure 2 may be lower than an elevation of a top surface 421 of the second layer 42 of the first spacer 4. The top surface 211 of the main portion 21 of the first bit line structure 2 may be an interface between the main portion 21 and the cap portion 22. The top surface 421 of the second layer 42 of the first spacer 4 may be an interface between the second layer 42 and the third layer 43.

As shown in FIG. 1 and FIG. 2, the second bit line structure 3 may include a main portion 31 and a cap portion 32 disposed on the main portion 31. The structure of the second bit line structure 3 may be same as or similar to the structure of the first bit line structure 2. The main portion 31 may include tungsten (W), and the cap portion 32 may include silicon nitride (SiN). The main portion 31 of the second bit line structure 3 may be electrically insulated from the second active area 12 and the third active area 13 through an insulator 33. The insulator 33 may be an electrical insulator and may be disposed between the main portion 31 of the second bit line structure 3 and a gap between the second active area 12 and the third active area 13. An example of a material of the insulator 33 may include nitride material.

The gap between the second active area 12 and the third active area 13 may be disposed under the second bit line structure 3. The width of the insulator 33 may be substantially equal to a width of the second bit line structure 3. Thus, the second bit line structure 3 may partially vertically overlap the second active area 12 and the third active area 13. In addition, the width of the insulator 33 may be substantially equal to the width W2 of the conductor 23, and the thickness of the insulator 33 may be substantially equal to the thickness of the conductor 23.

The structure of the second spacer 5 may be same as or similar to the structure of the first spacer 4. The second spacer 5 may be disposed around or adjacent to the second bit line structure 3. The second spacer 5 may include a first layer 51, a second layer 52 and a third layer 53. The first layer 51 may include silicon nitride (SiN), the second layer 52 may include oxide material such as silicon oxide ($SiO_2$), and the third layer 53 may include silicon nitride (SiN). The third layer 53 may be disposed over or disposed on the second layer 52. A width of the third layer 53 may be substantially equal to a width of the second layer 52.

The first layer 51 may be interposed between the second layer 52 and the second bit line structure 3. A width W5 of the first layer 51 may be less than a width W4 of the second layer 52. For example, the width W5 of the first layer 51 may be substantially equal to one half of the width W4 of the second layer 52. The material of the first layer 51 may be different from the material of the second layer 52. In addition, the first layer 51 may be interposed between the third layer 53 and the second bit line structure 3. The width W5 of the first layer 51 may be less than a width W3 of the third layer 53. For example, the width W5 of the first layer 51 may be substantially equal to one half of the width W3 of the third layer 53. The material of the first layer 51 may be same as the material of the third layer 53.

As shown in FIG. 2, a lateral surface of the second layer 52 may be substantially aligned with a lateral surface of the third layer 53. The first layer 51 may contact the lateral surface of the second layer 52 and the lateral surface of the third layer 53. A length (or a height) of the first layer 51 may substantially equal to a sum of a length (or a height) of the second layer 52 and a length (or a height) of the third layer 53. In addition, an elevation of a top surface 311 of the main portion 31 of the second bit line structure 3 may be lower than an elevation of a top surface 521 of the second layer 52 of the second spacer 5. The top surface 311 of the main portion 31 of the second bit line structure 3 may be an interface between the main portion 31 and the cap portion 32. The top surface 521 of the second layer 52 of the second spacer 5 may be an interface between the second layer 52 and the third layer 53.

As shown in FIG. 1 and FIG. 2, the at least one cell contact structure may include a plurality of cell contact structures, e.g., the first cell contact structure 6, the second cell contact structure 6a, the third cell contact structure 6b, the fourth cell contact structure 6c and the fifth cell contact structure 6d. The cell contact structure may be disposed or interposed between two spacers, and may be electrically connected to an active area of the base structure 10. For example. The first cell contact structure 6 may be disposed or interposed between the first spacer 4 and the second spacer 5, and may be electrically connected to the second active area 12 of the base structure 10.

The first cell contact structure 6 may include a first portion 61 and a second portion 62 disposed on the first portion 61. A material of the first portion 61 may include a conductive material such as polysilicon. A material of the second portion 62 may include a conductive material such as tungsten (W). The material of the first portion 61 may same as or different from the material of the second portion 62.

A top surface 611 of the first portion 61 of the first cell contact structure 6 may be not aligned with the top surface 421 of the second layer 42 of the first spacer 4. In some embodiments, an elevation of the top surface 611 of the first portion 61 of the first cell contact structure 6 may be higher than an elevation of the top surface 421 of the second layer 42 of the first spacer 4. Thus, the second portion 62 of the first cell contact structure 6 does not contact the second layer 42 of the first spacer 4. Alternatively, the second portion 62 of the first cell contact structure 6 does not horizontally overlap the second layer 42 of the first spacer 4.

In addition, the top surface 611 of the first portion 61 of the first cell contact structure 6 may be not aligned with the top surface 521 of the second layer 52 of the second spacer 5. In some embodiments, an elevation of the top surface 611 of the first portion 61 of the first cell contact structure 6 may be higher than an elevation of the top surface 521 of the second layer 52 of the second spacer 5. Thus, the second portion 62 of the first cell contact structure 6 does not contact the second layer 52 of the second spacer 5. Alternatively, the second portion 62 of the first cell contact structure 6 does not horizontally overlap the second layer 52 of the second spacer 5.

The third bit line structure 2a may include a main portion 21a and a cap portion 22a disposed on the main portion 21a. The structure of the third bit line structure 2a may be same as or similar to the structure of the first bit line structure 2. The main portion 21a of the third bit line structure 2a may be electrically connected to the fourth active area 11a through a conductor 23a. The conductor 23a may be an electrical contact and may be disposed between the main portion 21a of the third bit line structure 2a and the fourth active area 11a. An example of a material of the conductor 23a may include polysilicon. The fourth active area 11a may be disposed right under the third bit line structure 2a. A width of the fourth active area 11a may be less than a width of the conductor 23a. The width of the conductor 23a may be substantially equal to a width of the third bit line structure 2a. Thus, the third bit line structure 2a may completely vertically overlap the fourth active area 11a. The entire fourth active area 11a may be disposed within a vertical projection of the third bit line structure 2a.

The third spacer 4a may be disposed around or adjacent to the third bit line structure 2a. The third spacer 4a may include a first layer 41a, a second layer 42a and a third layer 43a. The structure of the third spacer 4a may be same as or similar to the structure of the first spacer 4. The third layer 43a may be disposed over or disposed on the second layer 42a. A width of the third layer 43a may be substantially equal to a width of the second layer 42a.

The first layer 41a may be interposed between the second layer 42a and the third bit line structure 2a. A width of the first layer 41a may be less than the width of the second layer 42a. For example, the width of the first layer 41a may be substantially equal to one half of the width of the second layer 42a. The material of the first layer 41a may be different from the material of the second layer 42a. In addition, the first layer 41a may be interposed between the third layer 43a and the third bit line structure 2a. The width of the first layer 41a may be less than the width of the third layer 43a. For example, the width of the first layer 41a may be substantially equal to one half of the width of the third layer 43a. The material of the first layer 41a may be same as the material of the third layer 43a.

A lateral surface of the second layer 42a may be substantially aligned with a lateral surface of the third layer 43a. The first layer 41a may contact the lateral surface of the second layer 42a and the lateral surface of the third layer 43a. A length (or a height) of the first layer 41a may substantially equal to a sum of a length (or a height) of the second layer 42a and a length (or a height) of the third layer 43a. In addition, an elevation of a top surface of the main portion 21a of the third bit line structure 2a may be lower than an elevation of a top surface of the second layer 42a of the third spacer 4a.

The second cell contact structure 6a may be disposed or interposed between the third spacer 4a and the second spacer 5, and may be electrically connected to the third active area 13 of the base structure 10. The second cell contact structure 6a may include a first portion 61 and a second portion 62 disposed on the first portion 61. The structure of the second cell contact structure 6a may be same as or similar to the structure of the first cell contact structure 6.

A top surface of the first portion 61 of the second cell contact structure 6a may be not aligned with the top surface of the second layer 42a of the third spacer 4a. In some embodiments, an elevation of the top surface of the first portion 61 of the second cell contact structure 6a may be higher than an elevation of the top surface of the second layer 42a of the third spacer 4a. Thus, the second portion 62 of the second cell contact structure 6a does not contact the second layer 42a of the third spacer 4a. Alternatively, the second portion 62 of the second cell contact structure 6a does not horizontally overlap the second layer 42a of the third spacer 4a.

In addition, the top surface of the first portion 61 of the second cell contact structure 6a may be not aligned with the top surface 521 of the second layer 52 of the second spacer 5. In some embodiments, an elevation of the top surface of the first portion 61 of the second cell contact structure 6a may be higher than an elevation of the top surface 521 of the second layer 52 of the second spacer 5. Thus, the second portion 62 of the second cell contact structure 6a does not contact the second layer 52 of the second spacer 5. Alternatively, the second portion 62 of the second cell contact structure 6a does not horizontally overlap the second layer 52 of the second spacer 5. In addition, the third cell contact structure 6b may contact the third spacer 4a.

The fourth bit line structure 3a may include a main portion 31a and a cap portion 32a disposed on the main portion 31a. The structure of the fourth bit line structure 3a may be same as or similar to the structure of the second bit line structure 3. The main portion 31a of the fourth bit line structure 3a may be electrically insulated from the fifth active area 12a and the sixth active area 13a through an insulator 33a. The insulator 33a may be an electrical insulator and may be disposed between the main portion 31a of the fourth bit line structure 3a and a gap between the fifth active area 12a and a sixth active area 13a.

The gap between the fifth active area 12a and the sixth active area 13a may be disposed under the fourth bit line structure 3a. The width of the insulator 33a may be substantially equal to a width of the fourth bit line structure 3a. Thus, the fourth bit line structure 3a may partially vertically overlap the fifth active area 12a and the sixth active area 13a.

The structure of the fourth spacer 5a may be same as or similar to the structure of the second spacer 5. The fourth spacer 5a may be disposed around or adjacent to the fourth bit line structure 3a. The fourth spacer 5a may include a first layer 51a, a second layer 52a and a third layer 53a. The third layer 53a may be disposed over or disposed on the second layer 52a. The first layer 51a may be interposed between the second layer 52a and the fourth bit line structure 3a. A width of the first layer 51a may be less than the width of the second layer 52a. In addition, the first layer 51a may be interposed between the third layer 53a and the fourth bit line structure 3a. The width of the first layer 51a may be less than the width of the third layer 53a.

The first layer 51a may contact the lateral surface of the second layer 52a and the lateral surface of the third layer 53a. A length (or a height) of the first layer 51a may substantially equal to a sum of a length (or a height) of the second layer 52a and a length (or a height) of the third layer 53a. In addition, an elevation of a top surface of the main portion 31a of the fourth bit line structure 3a may be lower than an elevation of a top surface of the second layer 52a of the fourth spacer 5a.

The fourth cell contact structure 6c may be disposed or interposed between the first spacer 4 and the fourth spacer 5a, and may be electrically connected to the sixth active area 13a of the base structure 10. The fourth cell contact structure 6c may include a first portion 61 and a second portion 62 disposed on the first portion 61. The structure of the fourth cell contact structure 6c may be same as or similar to the structure of the first cell contact structure 6. In addition, the fifth cell contact structure 6d may contact the fourth spacer 5a.

In some embodiments, the dielectric constant (k) of the first layer 41 (e.g., silicon nitride (SiN) material) of the first spacer 4 may be 7, and the dielectric constant (k) of the second layer 42 (e.g., oxide material) of the first spacer 4 may be 3.9. Thus, the dielectric constant (k) of the first layer 41 (e.g., silicon nitride (SiN) material) of the first spacer 4 may be greater than the dielectric constant (k) of the second layer 42 (e.g., oxide material) of the first spacer 4. As shown in FIG. 1 and FIG. 2, only the first layer 41 (e.g., silicon nitride (SiN) material) and the second layer 42 (e.g., oxide material) are disposed between the main portion 21 (e.g., tungsten material) of the first bit line structure 2 and the first portion 61 (e.g., polysilicon material) of the first cell contact structure 6. Thus, the dielectric constant (k) between the main portion 21 of the first bit line structure 2 and the first portion 61 of the first cell contact structure 6 may be relatively low. As a result, the parasitic capacitance adjacent to the main portion 21 of the first bit line structure 2 is reduced, and the signal margin is improved or increased.

In a comparative embodiment, a spacer between a bit line and a cell contact may be a tri-layered structure, such as a SiN-Ox-SiN structure. Since the dielectric constant (k) of SiN is 7, and the dielectric constant (k) of Ox is 3.9, the tri-layered structure includes two high k layers (i.e., SiN layers). Thus, the dielectric constant (k) of the tri-layered structure is relatively high, which makes a high parasitic capacitance to reduce the signal margin. That is, the SiN layer is the main trigger to make the high parasitic capacitance.

FIG. 3 through FIG. 9 illustrate a method of manufacturing a semiconductor structure 1 according to some embodiments of the present disclosure.

Figure 3:
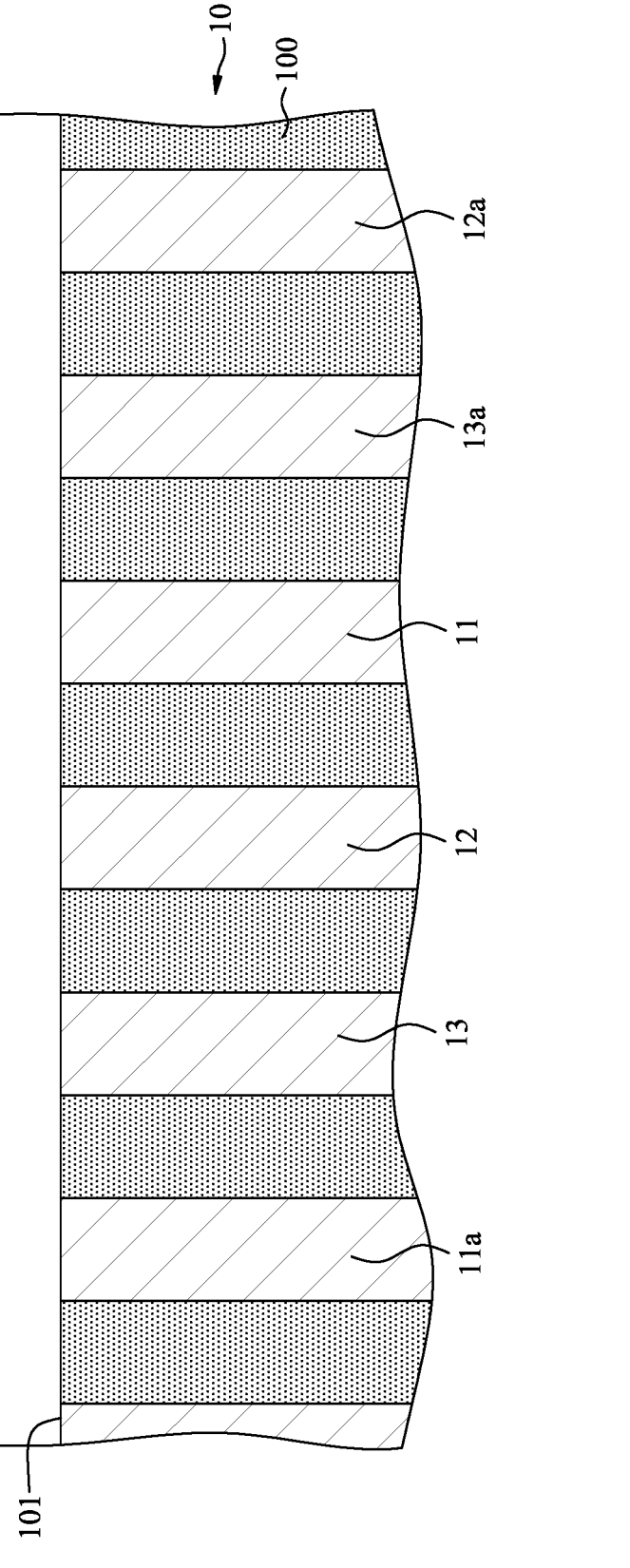
FIG. 3 illustrates a cross-sectional view of one or more stages of an example of a method of manufacturing a semiconductor structure according to some embodiments of the present disclosure.

Referring to FIG. 3, a base structure 10 is provided. The base structure 10 of FIG. 3 may be same as or similar to the base structure 10 of FIG. 1. The base structure 10 may be a substrate, and may include a dielectric material, such as an oxide material or a nitride material. Alternatively, the base structure 10 may be a substrate, and may include, for example, silicon (Si), germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some embodiments, the base structure 10 may include a base portion 100 and at least active area (e.g., a first active area 11, a second active area 12, a third active area 13, a fourth active area 11a, a fifth active area 12a and a sixth active area 13a) disposed in or embedded in the base portion 100. The base portion 100 may include dielectric oxide material. Each of the active areas (e.g., the first active area 11, the second active area 12, the third active area 13, the fourth active area 11a, the fifth active area 12a and the sixth active area 13a) in may include silicon (Si) material. For example, each of the first active area 11 and the fourth active area 11a may be a drain electrode. Each of the second active area 12, the third active area 13, the fifth active area 12a and the sixth active area 13a be a source electrode.

In some embodiments, the base structure 10 may have a first surface 101 (e.g., a top surface). The active areas (e.g., the first active area 11, the second active area 12, the third active area 13, the fourth active area 11a, the fifth active area 12a and the sixth active area 13a) may be exposed from the first surface 101 (e.g., the top surface) of the base structure 10.

Figure 4:
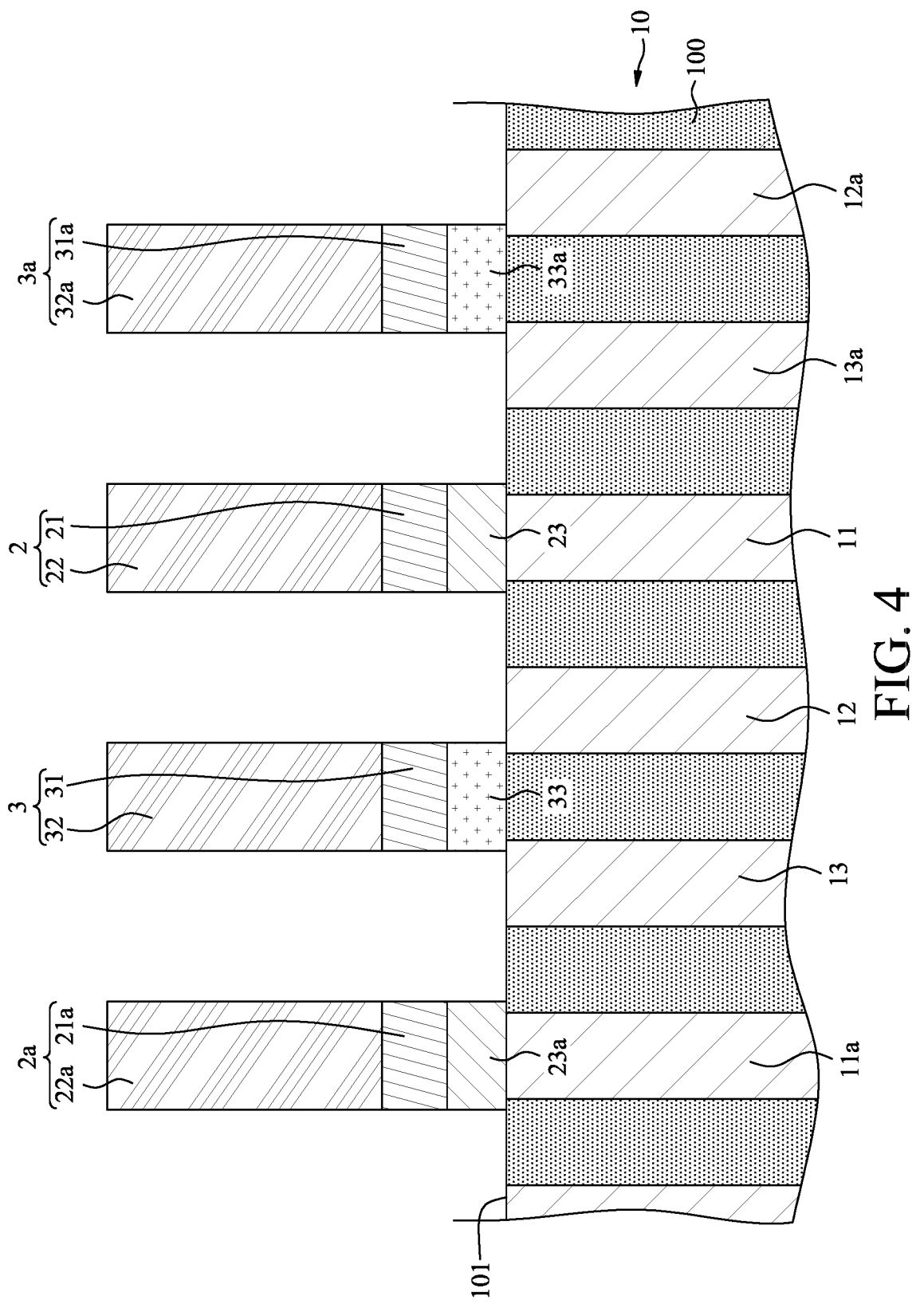
FIG. 4 illustrates a cross-sectional view of one or more stages of an example of a method of manufacturing a semiconductor structure according to some embodiments of the present disclosure.

Referring to FIG. 4, at least one bit line structure is formed over the at least one active area of the base structure 10. The at least one bit line structure may include a plurality of bit line structures, e.g., the first bit line structure 2, the second bit line structure 3, the third bit line structure 2a and the fourth bit line structure 3a, and may be disposed on the first surface 101 (e.g., a top surface) of the base structure 10. The first bit line structure 2 may include a main portion 21 and a cap portion 22 disposed on the main portion 21. The main portion 21 may include tungsten (W), and the cap portion 22 may include silicon nitride (SiN). The main portion 21 of the first bit line structure 2 may be electrically connected to the first active area 11 through a conductor 23. The conductor 23 may be an electrical contact and may be disposed between the main portion 21 of the first bit line structure 2 and the first active area 11. An example of a material of the conductor 23 may include polysilicon. The first active area 11 may be disposed right under the first bit line structure 2. A width of the first active area 11 may be less than a width of the conductor 23. The width of the conductor 23 may be substantially equal to a width of the first bit line structure 2. Thus, the first bit line structure 2 may completely vertically overlap the first active area 11. The entire first active area 11 may be disposed within a vertical projection of the first bit line structure 2.

The second bit line structure 3 may include a main portion 31 and a cap portion 32 disposed on the main portion 31. The structure of the second bit line structure 3 may be same as or similar to the structure of the first bit line structure 2. The main portion 31 may include tungsten (W), and the cap portion 32 may include silicon nitride (SiN). The main portion 31 of the second bit line structure 3 may be electrically insulated from the second active area 12 and the third active area 13 through an insulator 33. The insulator 33 may be an electrical insulator and may be disposed between the main portion 31 of the second bit line structure 3 and a gap between the second active area 12 and the third active area 13. An example of a material of the insulator 33 may include nitride material.

The gap between the second active area 12 and the third active area 13 may be disposed under the second bit line structure 3. The width of the insulator 33 may be substantially equal to a width of the second bit line structure 3. Thus, the second bit line structure 3 may partially vertically overlap the second active area 12 and the third active area 13. In addition, the width of the insulator 33 may be substantially equal to the width of the conductor 23, and the thickness of the insulator 33 may be substantially equal to the thickness of the conductor 23.

The third bit line structure 2a may include a main portion 21a and a cap portion 22a disposed on the main portion 21a. The structure of the third bit line structure 2a may be same as or similar to the structure of the first bit line structure 2. The main portion 21a of the third bit line structure 2a may be electrically connected to the fourth active area 11a through a conductor 23a. The conductor 23a may be an electrical contact and may be disposed between the main portion 21a of the third bit line structure 2a and the fourth active area 11a. An example of a material of the conductor 23a may include polysilicon. The fourth active area 11a may be disposed right under the third bit line structure 2a. A width of the fourth active area 11a may be less than a width of the conductor 23a. The width of the conductor 23a may be substantially equal to a width of the third bit line structure 2a. Thus, the third bit line structure 2a may completely vertically overlap the fourth active area 11a. The entire fourth active area 11a may be disposed within a vertical projection of the third bit line structure 2a.

The fourth bit line structure 3a may include a main portion 31a and a cap portion 32a disposed on the main portion 31a. The structure of the fourth bit line structure 3a may be same as or similar to the structure of the second bit line structure 3. The main portion 31a of the fourth bit line structure 3a may be electrically insulated from the fifth active area 12a and the sixth active area 13a through an insulator 33a. The insulator 33a may be an electrical insulator and may be disposed between the main portion 31a of the fourth bit line structure 3a and a gap between the fifth active area 12a and a sixth active area 13a.

The gap between the fifth active area 12a and the sixth active area 13a may be disposed under the fourth bit line structure 3a. The width of the insulator 33a may be substantially equal to a width of the fourth bit line structure 3a. Thus, the fourth bit line structure 3a may partially vertically overlap the fifth active area 12a and the sixth active area 13a.

Figure 5:
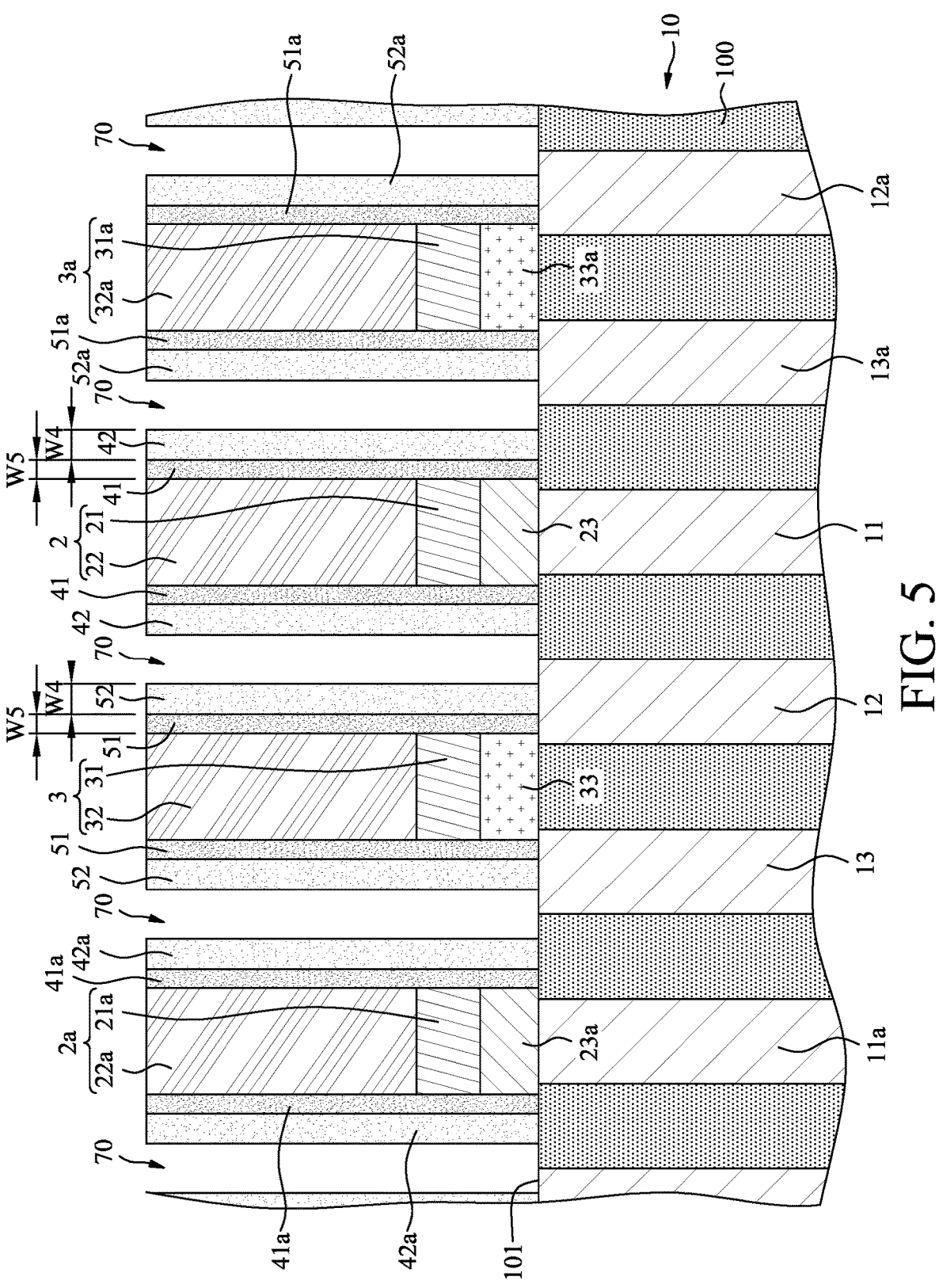
FIG. 5 illustrates a cross-sectional view of one or more stages of an example of a method of manufacturing a semiconductor structure according to some embodiments of the present disclosure.

Referring to FIG. 5, at least one first layer (e.g., a first layer 41, a first layer 51, a first layer 41a and a first layer 51a) may be formed around the at least one bit line structure (e.g., the first bit line structure 2, the second bit line structure 3, the third bit line structure 2a and the fourth bit line structure 3a) respectively. The first layer 41, 51, 41a, 51a may include silicon nitride (SiN). In some embodiments, the first layers 41, 51, 41a, 51a may be formed or disposed on the first surface 101 (e.g., the top surface) of the base structure 10, and may contact the bit line structures 2, 3, 2a, 3a, respectively.

Then, at least one second layer (e.g., a second layer 42, a second layer 52, a second layer 42a and a second layer 52a) may be formed around the first layer (e.g., the first layer 41, the first layer 51, the first layer 41a and the first layer 51a) respectively. The second layer 42, 52, 42a, 52a may include oxide material such as silicon oxide ($SiO_2$). In some embodiments, the second layers 42, 52, 42a, 52a may be formed or disposed on the first surface 101 (e.g., the top surface) of the base structure 10, and may contact the first layers 41, 51, 41a, 51a, respectively. A width W4 of the second layer 42, 52, 42a, 52a is greater than a width W5 of the first layer 41, 51, 41a, 51a. A height of the second layer 42, 52, 42a, 52a may be substantially equal to a height of the first layer 41, 51, 41a, 51a. Meanwhile, there are gaps 70 between the second layers 42, 52, 42a, 52a.

Figure 6:
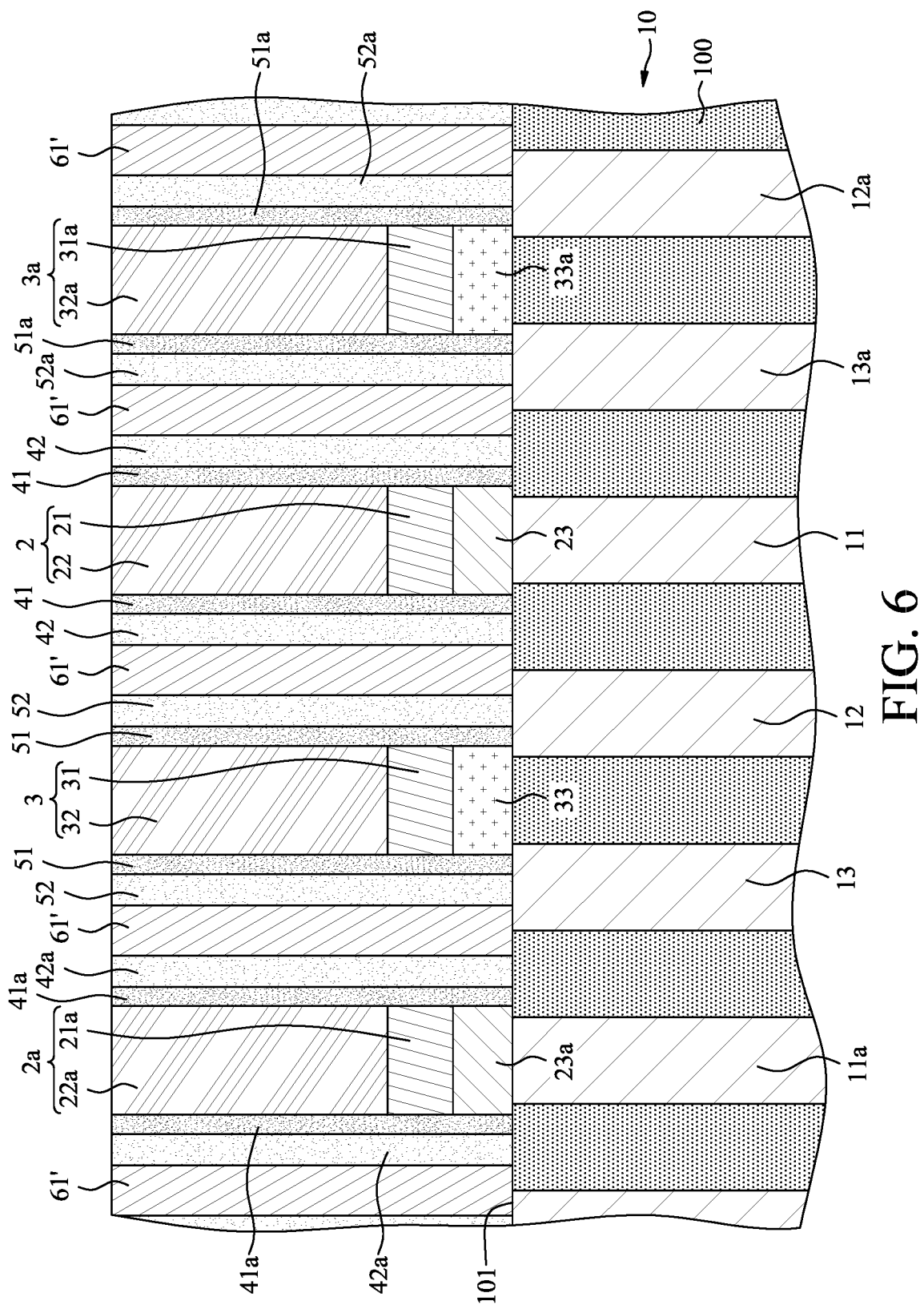
FIG. 6 illustrates a cross-sectional view of one or more stages of an example of a method of manufacturing a semiconductor structure according to some embodiments of the present disclosure.

Referring to FIG. 6, at least one contact layer 61' may be formed or disposed in the gaps 70 between the second layers 42, 52, 42a, 52a. The contact layer 61' may contact the second layers 42, 52, 42a, 52a. A material of the contact layer 61' may include a conductive material such as poly-silicon. In some embodiments, the contact layer 61' may be formed or disposed on the first surface 101 (e.g., the top surface) of the base structure 10, and may fill the gaps 70 between the second layers 42, 52, 42a, 52a. A height of the contact layer 61' may be substantially equal to the height of the second layer 42, 52, 42a, 52a and the height of the first layer 41, 51, 41a, 51a.

In some embodiments, a grinding or polishing process (e.g., chemical-mechanical planarization (CMP)) may be performed on the top surface of the contact layer 61', the top surface of the second layer 42, 52, 42a, 52a, the top surface of the first layer 41, 51, 41a, 51a and the top surface of the cap portion 22, 32, 22a, 32a of the bit line structure 2, 3, 2a, 3a. Thus, the top surface of the contact layer 61', the top surface of the second layer 42, 52, 42a, 52a, the top surface of the first layer 41, 51, 41a, 51a and the top surface of the cap portion 22, 32, 22a, 32a of the bit line structure 2, 3, 2a, 3a may be coplanar with each other.

Figure 7:
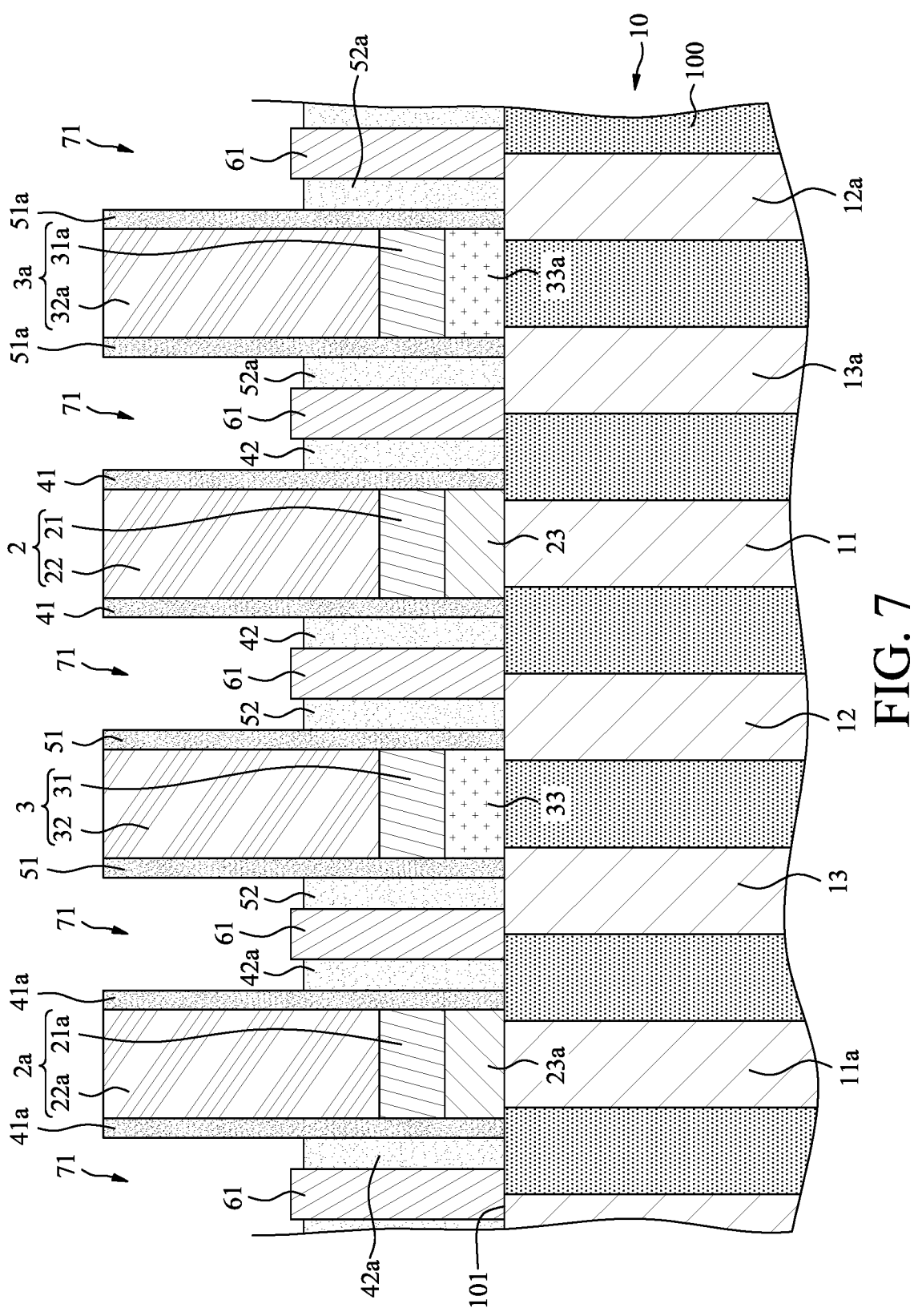
FIG. 7 illustrates a cross-sectional view of one or more stages of an example of a method of manufacturing a semiconductor structure according to some embodiments of the present disclosure.

Referring to FIG. 7, a portion (e.g., an upper portion) of the contact layer 61' may be removed to form a first portion 61. A portion (e.g., an upper portion) of the second layer 42, 52, 42a, 52a may be removed. Thus, the height of the second layer 42, 52, 42a, 52a may be reduced. As shown in FIG. 7, the first portion 61 may protrude from the remaining second layer 42, 52, 42a, 52a. A height of the first portion 61 may be greater than a height of the remaining second layer 42, 52, 42a, 52a. An elevation of the top surface of the first portion 61 may be higher than an elevation of the top surface of the second layer 52. Meanwhile, there are gaps 71 between the upper portions of the first layers 41, 51, 41a, 51a.

Figure 8:
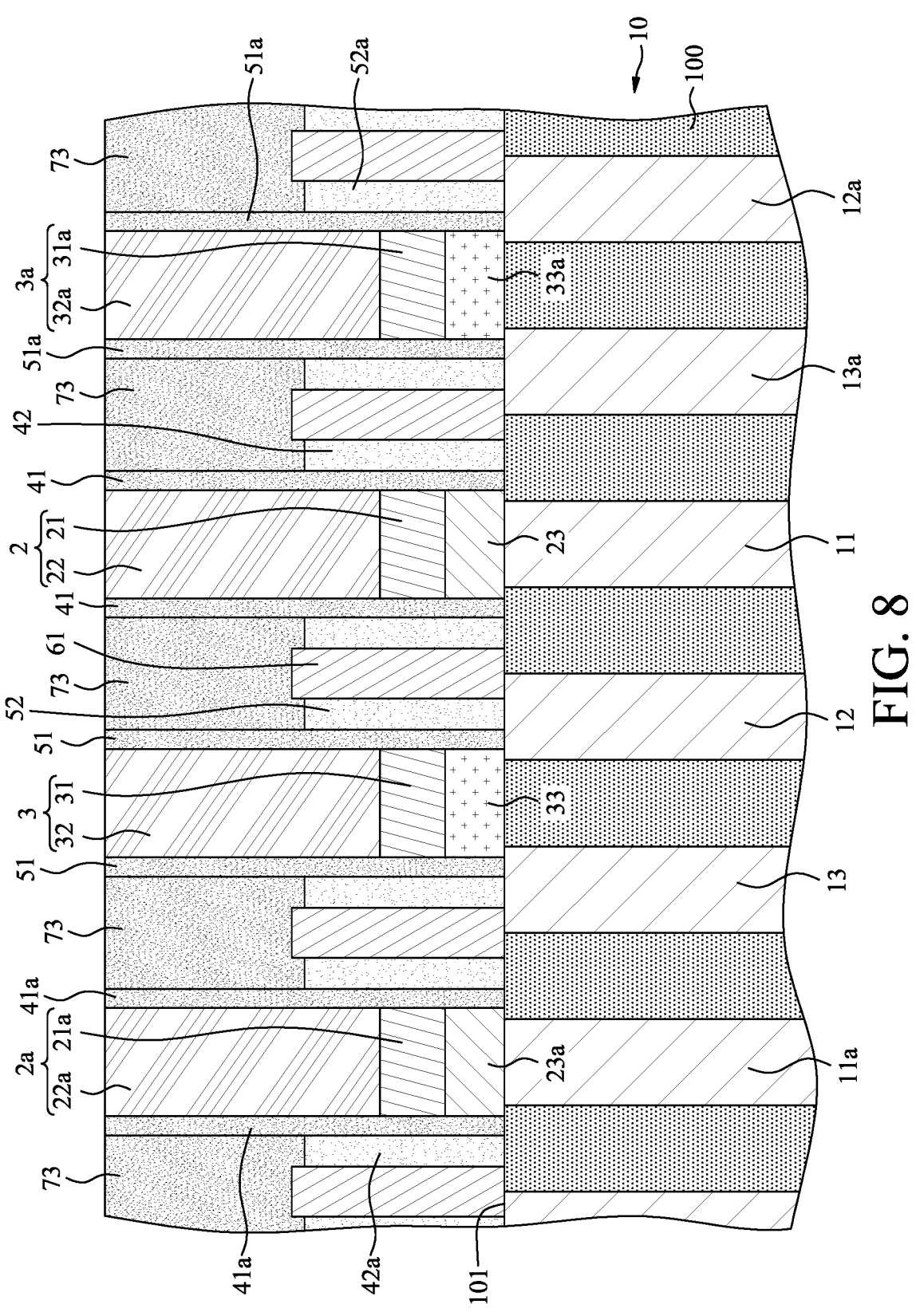
FIG. 8 illustrates a cross-sectional view of one or more stages of an example of a method of manufacturing a semiconductor structure according to some embodiments of the present disclosure.

Referring to FIG. 8, a cover layer 73 may be formed or disposed in the gaps 71 between the upper portions of the first layers 41, 51, 41a, 51a. The cover layer 73 may include silicon nitride (SiN). In some embodiments, the cover layer 73 may fill the gaps 71 between the second layers 42, 52, 42a, 52a so as to cover and contact the first portion 61 and the second layer 42, 52, 42a, 52a.

Figure 9:
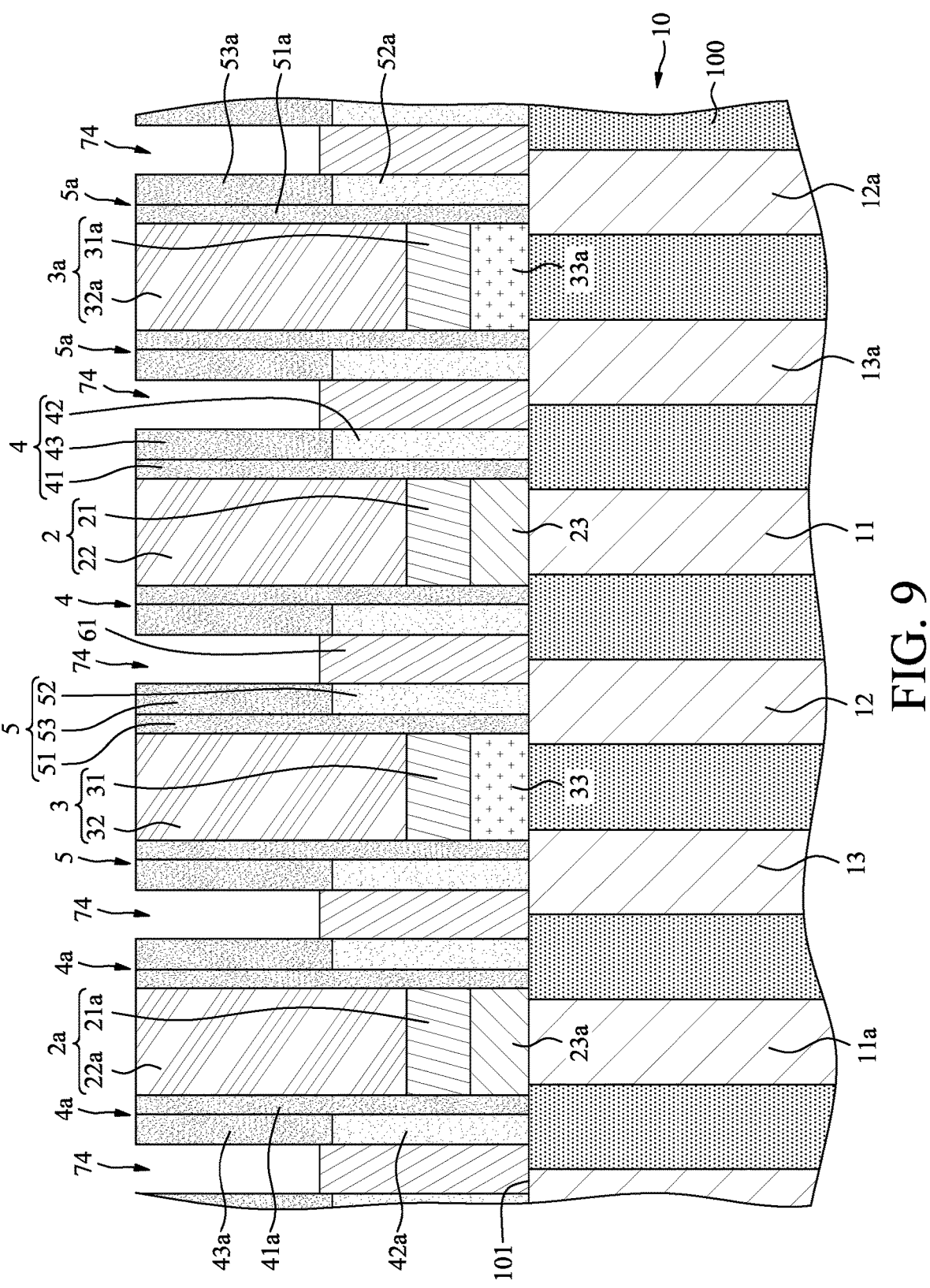
FIG. 9 illustrates a cross-sectional view of one or more stages of an example of a method of manufacturing a semiconductor structure according to some embodiments of the present disclosure.

Referring to FIG. 9, a portion of the cover layer 73 on the first portion 61 may be removed to form at least one opening 74 corresponding to the first portion 61. That is, the opening 74 may be recessed from the top surface of the cover layer 73 to expose the first portion 61. The remaining cover layer 73 may become a third layer 43, 53, 43a, 53a formed on the second layer 42, 52, 42a, 52a. The opening 74 may be defined by the third layer 43, 53, 43a, 53a and the first portion 61.

Meanwhile, at least one spacer (e.g., a first spacer 4, a second spacer 5, a third spacer 4a and a fourth spacer 5a) may be formed around the at least one bit line structure (e.g., a first bit line structure 2, a second bit line structure 3, a third bit line structure 2a and a fourth bit line structure 3a) respectively. The structure of the spacer 4, 5, 4a, 5a of FIG. 9 may be same as or similar to the structure of the spacer 4, 5, 4a, 5a of FIG. 1. For example, the first spacer 4 may include a first layer 41, a second layer 42 and a third layer 43. The third layer 43 may be disposed over the second layer 42, and a width of the third layer 43 may be substantially equal to a width of the second layer 42.

Then, a second portion 62 may be formed or disposed in the opening 74. Thus, the second portion 62 may fill the opening 74, and may be formed or disposed on the first portion 61 to form a cell contact structure 6, 6a, 6b, 6c, 6d. Therefore, a semiconductor structure 1 shown in FIG. 1 is obtained. Meanwhile, the cell contact structure 6, 6a, 6b, 6c, 6d may include the first portion 61 and the second portion 62. A material of the second portion 62 may include a conductive material such as tungsten (W).

FIG. 10 illustrates a flow chart of a method 900 of manufacturing a semiconductor structure according to some embodiments of the present disclosure.

In some embodiments, the method 900 can include a step S901, providing a base structure, wherein the base structure includes a base portion and at least one active area in the base portion.

For example, as shown in FIG. 3, a base structure 10 is provided. The base structure 10 includes a base portion 100 and at least one active area 11, 12, 13, 11a, 12a, 13a in the base portion 100.

In some embodiments, the method 900 can include a step S902, forming at least one bit line structure over the at least one active area of the base structure. For example, as shown in FIG. 4, the at least one bit line structure 2, 3, 2a, 3a is formed over the at least one active area 11, 12, 13, 11a, 12a, 13a of the base structure 10.

In some embodiments, the method 900 can include a step S903, forming at least one spacer around the at least one bit line structure, wherein the least one spacer includes a first layer, a second layer and a third layer, wherein the third layer is disposed over the second layer and a width of the third layer is substantially equal to a width of the second layer. For example, as shown in FIG. 1, at least one spacer 4, 5, 4a, 5a is formed around the at least one bit line structure 2, 3, 2a, 3a. The least one spacer 4, 5, 4a, 5a includes a first layer 41, 51, 41a, 51a, a second layer 42, 52, 42a, 52a and a third layer 43, 53, 43a, 53a. The third layer 43, 53, 43a, 53a is disposed over the second layer 42, 52, 42a, 52a, and a width of the third layer 43, 53, 43a, 53a is substantially equal to a width of the second layer 42, 52, 42a, 52a.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure, comprising:
a base structure;
a first bit line structure disposed over the base structure;
a second bit line structure disposed over the base structure;
a first spacer disposed around the first bit line structure, and including a first layer, a second layer and a third layer, wherein
the third layer of the first spacer is disposed over the second layer of the first spacer,
the third layer of the first spacer is formed of a different material from the second layer of the first spacer,
a width of the third layer of the first spacer is equal to a width of the second layer of the first spacer, wherein a top surface of the first bit line structure is coplanar with a top surface the first layer of the first spacer and a top surface of the third layer of the first spacer, and
the third layer of the first spacer having the same width from the top surface of the third layer of the first spacer to the second layer the first spacer; and
a second spacer disposed around the second bit line structure, and including a first layer, a second layer and a third layer, wherein
the third layer of the second spacer is disposed over the second layer of the second spacer,
the third layer of the second spacer is formed of a different material from the second layer of the second spacer,
a width of the third layer of the second spacer is equal to a width of the second layer of the second spacer,
wherein a top surface of the second bit line structure is coplanar with a top surface the first layer of the second spacer and a top surface of the third layer of the second spacer, and
the third layer of the second spacer having the same width from the top surface of the third layer of the second spacer to the second layer the second spacer.

2. The semiconductor structure of claim 1, wherein the base structure includes a base portion, a first active area in the base portion and second active area in the base portion, wherein the first bit line structure is electrically connected to the first active area through a conductor, and the second bit line structure is electrically insulated from the second active area through an insulator.

3. The semiconductor structure of claim 1, further comprising a cell contact structure interposed between the first spacer and the second spacer, wherein the cell contact structure is electrically connected to an active area of the base structure.

4. The semiconductor structure of claim 3, wherein the cell contact structure includes a first portion and a second portion disposed on the first portion.

5. The semiconductor structure of claim 4, wherein a top surface of the first portion of the cell contact structure is not aligned with a top surface of the second layer of the first spacer.

6. The semiconductor structure of claim 5, wherein an elevation of the top surface of the first portion of the cell contact structure is higher than an elevation of the top surface of the second layer of the first spacer.

7. The semiconductor structure of claim 3, wherein the second portion of the cell contact structure does not contact the second layer of the first spacer.

8. The semiconductor structure of claim 3, wherein the second portion of the cell contact structure does not horizontally overlap the second layer of the first spacer.

* * * * *